United States Patent [19]

Chiang

[11] Patent Number: 4,576,900
[45] Date of Patent: Mar. 18, 1986

[54] INTEGRATED CIRCUIT MULTILEVEL INTERCONNECT SYSTEM AND METHOD

[75] Inventor: Ping-Wang Chiang, Los Gatos, Calif.

[73] Assignee: Amdahl Corporation, Sunnyvale, Calif.

[21] Appl. No.: 649,531

[22] Filed: Sep. 11, 1984

Related U.S. Application Data

[63] Continuation of Ser. No. 310,089, Oct. 9, 1981, abandoned.

[51] Int. Cl.$^4$ .............................................. G03C 5/00
[52] U.S. Cl. ..................... 430/313; 430/314; 430/315; 430/316; 430/317; 430/318; 430/329; 427/96
[58] Field of Search ............... 430/313, 314, 315, 317, 430/329, 316, 318; 427/96; 174/68.5

[56] References Cited

U.S. PATENT DOCUMENTS

| | | | |
|---|---|---|---|
| Re. 29,284 | 6/1977 | Shaheen et al. | 204/15 |
| 2,884,571 | 4/1959 | Hannahs | 204/15 X |
| 3,605,260 | 9/1971 | Sprideo et al. | 29/625 |
| 3,622,384 | 11/1971 | Davey et al. | 357/68 |
| 3,791,858 | 2/1974 | McPherson et al. | 430/319 X |
| 3,922,479 | 11/1975 | Older et al. | 174/68.5 |
| 3,976,524 | 8/1976 | Feng | 156/8 |
| 4,307,179 | 12/1981 | Chang et al. | 430/314 |
| 4,377,633 | 3/1983 | Abrahamovich et al. | 430/312 |
| 4,389,281 | 6/1983 | Anantha et al. | 156/646 |
| 4,451,326 | 5/1984 | Gwozdz | 156/643 |
| 4,463,084 | 7/1984 | Mitsumori et al. | 430/315 |

FOREIGN PATENT DOCUMENTS 54-158884  12/1979  Japan .................................... 430/314

Primary Examiner—John E. Kittle
Assistant Examiner—José G. Dees
Attorney, Agent, or Firm—Fliesler, Dubb, Meyer & Lovejoy

[57] ABSTRACT

A process for forming on a substructure a plural layer, conductor interconnect pattern consisting of a plurality of successively formed, substantially planar, composite layers of insulating material and conductive material with said insulating material on each layer defining a pattern of regions filled with conductive material to serve as part of a vertical and horizontal interconnect system. The process includes the following steps for forming each composite layer:

(a) forming a pattern of regions of conductive material on the substructure;

(b) forming over the pattern of conductive regions a layer of insulating material to a thickness substantially greater than the thickness of the conductive material and having a substantially planar top surface; and (c) removing top surface portions of the layer of insulating material down to the top surface of the regions of conductive material. The step of forming the layer of insulating material includes dispensing onto the wafer a volume of a liquid form of the insulating material to fill gaps between the regions of conductive material and to build up a layer of the insulating material having a substantially planar top surface.

17 Claims, 29 Drawing Figures

FIG.—29

INTEGRATED CIRCUIT MULTILEVEL INTERCONNECT SYSTEM AND METHOD

This is a continuation, of Ser. No. 310,089, filed Oct. 9, 1981.

FIELD OF THE INVENTION

This invention relates in general to integrated circuits and methods of manufacturing integrated circuits. More particularly, this invention relates to a system for interconnecting circuit elements and a process for forming a multilevel conductor interconnect pattern on an integrated circuit wafer.

BACKGROUND OF THE INVENTION

Over the past several years rapid progress has been made in increasing the density of integrated circuits. The semiconductor industry has progressed from small scale integrated circuits to large scale integrated circuits and is currently on the threshold of very large scale integrated circuits. As the density of circuits fabricated on each chip on a wafer has increased, problems have arisen in attempting to provide interconnections between circuit elements. To take full advantage of increased circuit density, it is necessary to be able to make interconnections among the circuit elements in a high density manner. Generally with today's level of integration of circuits on a chip, interconnections cannot be made in a single level network of conductive material formed on the wafer. Instead, it is necessary to provide at least several levels of conductor networks on the wafer, each separated by an insulating layer through which contact windows or vias are formed, in order to distribute signals among circuits on the chip and to provide interconnection between individual conductor networks at various levels.

Prior art multilevel interconnect systems have generally utilized a straightforward approach of normal photoresist patterning and etching operations to construct successive layers of insulating material and conducting material (metal) to form an interconnect system. Windows are defined in the insulating material for allowing contacts between the circuit elements on wafer and the first metal layer, and between the respective metal layers in the successive multilevel arrangement. Metal layers are etched to form the predefined conduction paths of the network of the integrated circuit. However, because of process related design constraints inherently involved in this straightforward process, the multilevel interconnect systems which can be produced greatly limit the overall density of interconnection among the various layers. In addition, the yield and reliability of this interconnect system is generally poor because of its non-planar surface topology.

Figure 1:
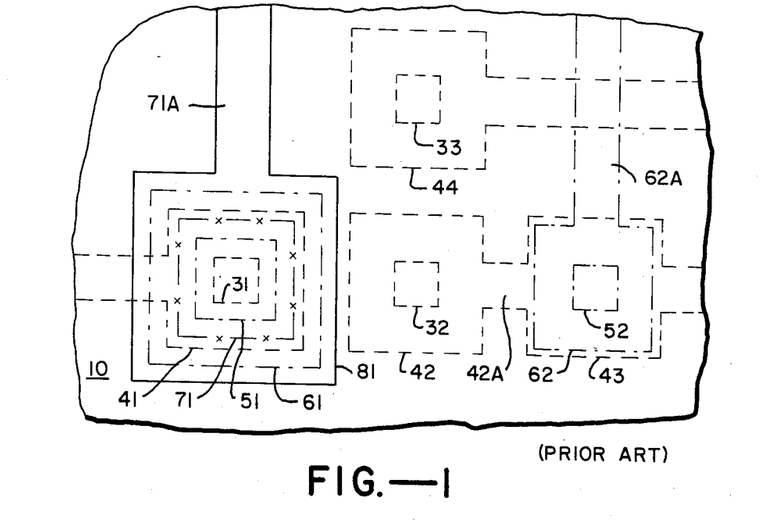
FIG. 1 is a plan view of a portion of the topography of the multilevel interconnect system in accordance with the prior art.
Figure 2:
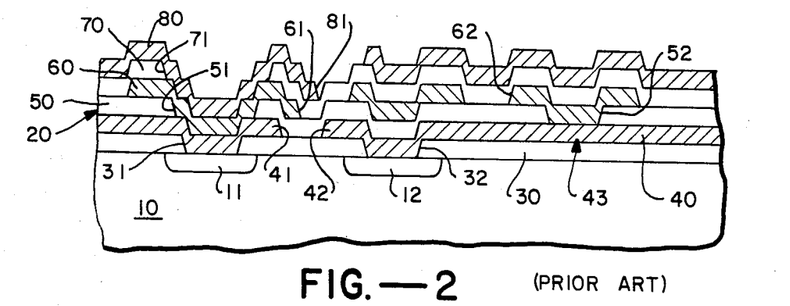
FIG. 2 is a section view of the topology of one type of multilevel conductor interconnect system in the prior art.
Figure 3:
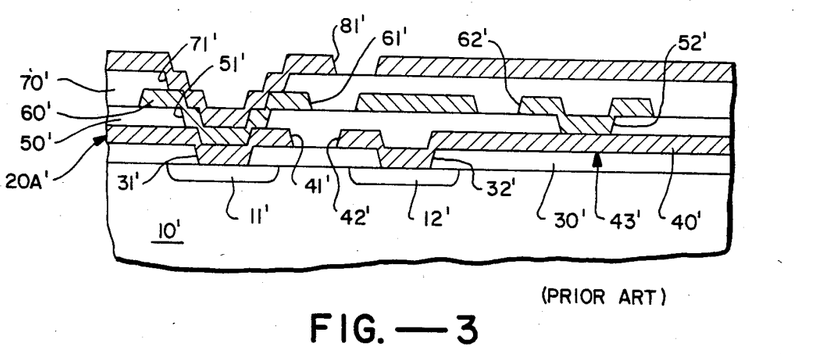
FIG. 3 is a section view of the topology of another type of multilevel conductor interconnect system in the prior art.

FIGS. 1, 2, and 3 in the attached drawings depict two common prior art multilayer interconnect systems. FIG. 1 is a plan view generally depicting the topographical layout of some of the various levels of metal conductor networks and contact windows in the two prior art multilevel interconnect systems depicted in cross-section in FIGS. 2 and 3. FIG. 2 depicts the cross-section through a multilayer conductor interconnect system which utilizes a straightforward process of forming successive layers of insulating material and metal on the integrated circuit wafer. FIG. 3 illustrates a modified prior art process which involves planarizing the layers of insulating material interposed between the metal layers.

FIGS. 1, 2, and 3 generally illustrate several of the limiting factors and problems involved in the multilevel interconnect systems of the prior art. These limitations and problems involve the large chip area and the steep metal step which is required for making a three-level interconnection between a substrate region such as region 11 in substrate 10 in FIGS. 2 and 3 and a third layer of metal 80 formed on the wafer. Because of the large area occupied by this three-level interconnect, other contact windows to the substrate 10 must be spaced an adequate distance from the adjacent three-level connection in order to provide sufficient electrical isolation between the connections. In addition, wherever it is desired to make a connection between two successive metal layers, it is necessary at each location to enlarge the path of the lower layer at that point in order to allow for mask alignment errors which may occur in carrying out the photomasking and etching operation utilized to provide the contact window in the overlying insulating layer. Furthermore, the overlying metal layer is required to have a large contact area in order to allow for tolerances in alignment of the photomask used to define the metal contact region with respect to the previously formed window in the underlying insulating layer. These allowances for misalignment of successive photomask and etching operations can best be understood from a description of successive process steps performed to build up the multilevel topology depicted in FIGS. 2 and 3.

Referring briefly to FIG. 2, substrate 10 generally designates a semiconductor wafer which has already been processed to fabricate a large number of individual integrated circuit chips. A substantial number of process steps have already been performed to provide a circuit formed of various diffused regions, such as regions 11 and 12, in the substrate 10. It should be understood that many junctions in the silicon substrate are not shown in the figures in order to make the explanation of this invention easier to understand. For purposes of illustration, FIG. 2 depicts a section of an integrated circuit which has been processed in a bipolar process in which the actual circuitry is fabricated in the substrate itself. It should be understood, however, that these multilevel conductor interconnect systems can also be readily adapted to conductor-insulator-semiconductor (CIS) integrated circuit technology. CIS technology involves not only the formation of diffused regions in the substrate but also the fabrication of a topological structure on the substrate consisting of insulating and conducting layers in order to create field effect device structures in the form of transistors and capacitors as well as other circuit elements such as resistors and the like.

After the wafer has been processed to the point that connections are required among various doped regions on the substrate 10, such as regions 11 and 12 depicted in FIG. 2, the first step in forming a multilevel interconnect system is to form an insulating layer 30 across the entire surface of the wafer. Insulating layer 30 is then patterned using a standard photomasking and etching operation to produce contact windows 31 and 32 corresponding to diffused regions 11 and 12. Because of mask alignment errors which may occur between the separate photomasking operations which define the diffused regions 11 and 12 and the windows 31 and 32, the area of the contact windows 31 and 32 must be smaller than the surface area of the diffused regions 11 and 12. The required differential between these areas depends on the design rules of a particular production process which, in turn, depends on the accuracy of the photomasks and alignment equipment being utilized.

Once the windows 31 and 32 have been etched into insulating layer 30, the photoresist mask pattern overlying the insulating layer 30 is removed and a layer of conductive material, such as aluminum or an aluminum alloy, is deposited over the entire surface of the wafer. Then another photomasking and etching operation is performed to pattern the metal layer 40 into a network of conductor pathways and contact pads. As shown in FIGS. 1 and 2, the contact pads designated 41 and 42 in metal layer 40 are made substantially larger than the area of corresponding windows 31 and 32 which communicate with the surface of substrate 10. These large metal contact pads are provided to allow for misalignment of both the photomask used to pattern metal layer 40 and the photomask used to pattern underlying insulating layer 30 and also misalignment which may later occur for a third photomask used to pattern the overlying oxide layer 50 in order to provide another contact window for the second metal layer 60. Where contact is to be made to the substrate or between successive metal layers, an enlarged contact pad must be provided to assure that the metal will completely cover the window in the underlying oxide layer.

Metal contact pad 41 is also made larger than the window aperture 31 because the overlying contact window 51 in the next insulating layer 50 is formed larger than the underlying contact window 31 to decrease the steepness of the metal step formed as the next layer of metal is deposited on the wafer. Each succeeding contact window in overlying insulating layers 50 and 70 is made larger in order to reduce the steepness of the step in the metal layer formed thereat. As successive metal contact regions are built up, the areas of the metal contact regions, for example, regions 41, 61, and 81, progressively get larger to allow for misalignment in the photomasks used to create these structures. The large area of the chip occupied by these three-level metal contact points results in a low interconnect density which limits the density of circuitry that can be effectively created in the integrated circuit substrate itself.

Referring briefly to the contact pad 43 shown in FIGS. 1 and 2, it can also be seen that substantial chip area is consumed where a single level interconnection is being made. The narrow conductive path 42A must be broadened out to form contact pad 43 in order to provide for misregistration between contact window 52 and contact pad 43. Correspondingly, the size of metal contact pad 62 is substantially larger than window aperture 52 in order to provide for misregistration of the photomasks defining these two structures. This requirement for "undersized vias" or "small contact windows" with respect to large contact pads greatly reduces the density of the overall interconnect system. Moreover, despite the attempts to produce gradual slope in the metal steps employed in making a connection between three sequential metal layers such as shown in the left-hand portion of FIG. 2, the thinness of the metal layers in certain regions somtimes results in fracturing of the metal which in turn causes an open circuit condition and a defective chip. Accordingly, the overall production yield of an integrated circuit fabrication operation is adversely impacted by the problems involved in fabricating a multilevel interconnect system of this prior art type.

The prior art multilevel interconnect system depicted in FIG. 3 is a modified form type which shares the disadvantages of the approach depicted in FIG. 2 from the standpoint of the area occupied by the various interconnect points. In the process used to fabricate the structure depicted in FIG. 3, the various insulating layers 30, 50, and 70 are made planar to eliminate some of the metal steps in the system. This planarization may be performed using either a silicon dioxide reflow process which smooths out the surfaces of the silicon dioxide insulator layers or by utilizing a layer of silicon dioxide or polyimide initially dispensed onto the wafer in liquid form to fill in gaps in the underlying structure while providing a generally planar top surface. The process depicted in FIG. 3 does not improve the overall density of the multilevel interconnect system but does ameliorate some of the manufacturing yield problems by reducing the number of metal steps. As very large scale integration progresses, interconnect density of multilevel systems must be improved to take full advantage of increased circuit densities.

Figure 4:
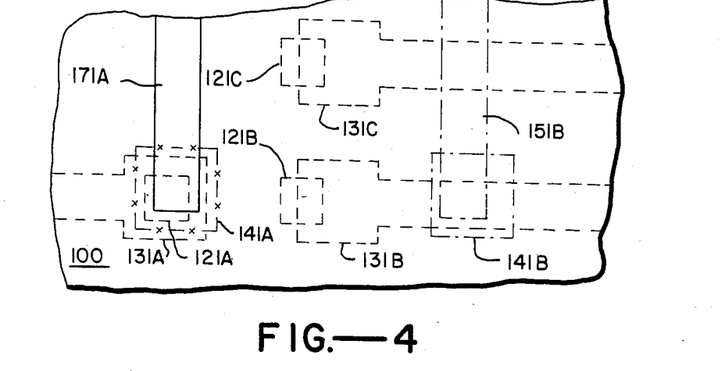
FIG. 4 is a plan view of the topography of a portion of multilevel conductor interconnect system in accordance with the above-referenced copending Chiang application and in accordance with this invention.
Figure 5:
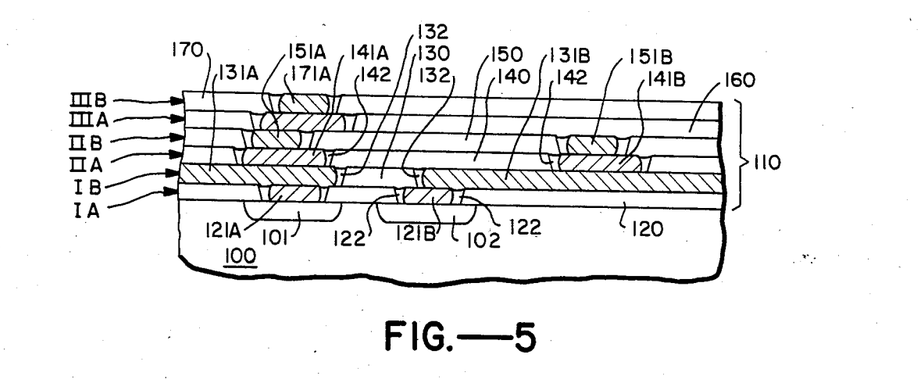
FIG. 5 is a section view of the topology of one embodiment of the multilevel conductor interconnect system in accordance with the above-referenced copending Chiang application.

FIGS. 4 and 5 depict one approach to improving interconnect density in a multilevel interconnect system as disclosed in a co-pending and commonly assigned Chiang patent application Ser. No. 188,482, abandoned, "Integrated Circuit Multilevel Interconnect System and Method," and filed Sept. 18, 1980. As shown in FIG. 5, the cross-sectional topology of this improved multilevel conductor interconnect system generally involves a semiconductor wafer 100 and a multilevel conductor interconnect system 110 formed on the surface of wafer 100. Wafer 100 is a processed semiconductor wafer with the circuitry already formed therein. The wafer 100 generally depicted in FIG. 5 is exemplary of a wafer processed in accordance with some type of bipolar semiconductor process which involves fabricating the integrated circuit components in the wafer itself with little or no topologic structure built on the surface of the wafer.

The particular multilevel conductor interconnect pattern 110 depicted in FIG. 5 corresponds generally to the interconnect pattern shown in FIGS. 1, 2, and 3 systems in order to contrast the higher density of that interconnect system. As depicted in FIG. 5, multilevel conductor interconnect system 110 involves six planar composite layers of insulating and metal material grouped in three pairs (e.g., IA, IB forming a first pair). The three pairs of composite layers provide a three-level interconnect system. The first layer in each pair of layers generally is a contact window or via layer with the second layer comprising a patterned conductor interconnect network involving a plurality of conductor pathways extending between contact window locations which provide contact points to the semiconductor substrate or to an adjacent conductor interconnect level. Composite layer IA formed on substrate 100 consists of patterned regions of a first insulating material 120 which basically define contact windows for doped regions 101 and 102 in substrate 100. Conductive material sections 121A and 121B, which may be any metal or other conductor material typically used in the semiconductor industry, form contacts to the regions 101 and 102. Surrounding the metal contact regions 121A and 121B are small gap-filling regions of a second insulating material 122.

Each layer of interconnect system 110 generally has the same structural characteristics, i.e. it is a composite of two insulator materials and a conductive material. Thus, layer IB includes regions of a first insulator material 130 which generally define an interconnecting conductor network composed of conductors 131A, 131B, and 131C as outlined in FIG. 4. The gap-filling regions 132 of a second insulating material complete the structure of composite layer IB. Layer IIA is another window or via layer and illustrates the adaptability of the interconnect system of FIG. 5 to utilization of what are called "oversized vias", which simply means that the geometric area of the via or window is larger than the underlying conductor path. This is illustrated in FIG. 4 at the bottom righthand corner where it is seen that the metal region 141B lies within a window which is larger than the underlying segment of the conductor 131B and also larger than the segment of the overlying conductor 51B which metal contact region 141B interconnects. Contrasting this oversized via approach to the large contact pad, undersized via approach utilized in the systems as depicted in FIGS. 1 and 2, it will be readily appreciated that the oversized via approach provides a higher density of vias or windows and higher density of interconnect paths in each level of the interconnect system. FIG. 4 shows only some of the topography of the various conductor paths and windows or vias in the interconnect network 110 in order to demonstrate generally the arrangement of the various conductor regions without confusion of overlapping geometries.

While the multilevel interconnect system and method disclosed in the above-referenced copending Chiang patent application provides increased interconnect density and eliminates problems associated with steep metal steps, the process disclosed requires some carefully controlled etching steps. In one embodiment there is an etching operation in which an etch stop layer is not present underneath the layer being patterned. In another embodiment careful control of an etch back operation is required in order to maintain the planar topology of the individual composite layers as they are formed. In addition the system and method of the prior application is somewhat difficult to adapt to forming multilevel interconnect arrangements on top of processed wafers which already have an uneven topology involving hills and valleys due to an arrangement of insulating and/or conducting layers previously formed on the substrate.

Accordingly, it is the principal object of this invention to provide an improved plural layer conductor interconnect system.

More specifically, it is an object of this invention to provide a plural level conductor interconnect system having high interconnect density and adaptability to any wafer topology.

It is another object of this invention to provide a simplified process for forming an improved plural level conductor interconnect system.

SUMMARY OF THE INVENTION

The above-stated objects are achieved in accordance with one aspect of this invention by providing a plural layer conductor interconnect system which comprises a plurality of successively formed, substantially planar, composite layers of insulating material and conductive material on an IC wafer to define a prearranged pattern of vertical and horizontal interconnect pathways, with each of the composite layers consisting of a single insulating material defining a pattern of regions filled with conductive material.

More specifically a plural layer conductor interconnect system of this invention may be employed on an integrated circuit wafer having circuit elements formed in surface regions of the wafer and having a substantially planar wafer surface topology. In such an application the interconnect system comprises a first substantially planar composite layer of insulating material and conductive material formed on the wafer surface and consisting of a single insulating material defining a pattern of prearranged regions filled with conductive material to serve as electrical contact elements to corresponding surface regions of the wafer. The remainder of the interconnect system comprises a plurality of successively formed, substantially planar, composite layers of insulating material and conductive material defining a prearranged pattern of vertical and horizontal interconnect pathways. Each of these layers also consists of a single insulator material defining a pattern of regions filled with conductive material.

As applied to an integrated circuit wafer having a substantially varying surface topology with surface hills and valleys, an interconnect system in accordance with this invention comprises a first plurality of successively formed composite layers of insulating material and conductive material located within said valleys and defining vertical multilevel contact columns of conductive material in preselected valleys. These first composite layers fill all of the valleys substantially to the height of the highest hill on the wafer to produce a substantially planar surface topology having vertical multilevel conductor columns extending down to the wafer surface or to other regions on the wafer to which a connection is desired to be made. The remainder of the interconnect system comprises a second plurality of successively formed composite layers of insulating material and conductive material disposed on top of the first plurality of layers and defining a prearranged pattern of vertical and horizontal interconnect pathways. This second plurality of composite layers may consist either of the types of composite layers disclosed in the above-referenced copending Chiang application. Preferably, however, each of the layers in the first plurality of composite layers as well as each of the layers in the second plurality of composite layers consists of a single insulating material defining a pattern of regions filled with conductive material.

The plural layer interconnect system of this invention is also adaptable for use on an integrated circuit wafer having thereon a substantially planar layer of silicon oxide patterned to define contact windows to substrate regions. In this case the interconnect system comprises a patterned layer of conductive material disposed on the silicon oxide layer including regions of conductive material filling the contact windows and overlying surface regions of the layer of silicon oxide to create an irregular surface topology of hills and valleys. A layer of insulating material is disposed on the wafer to form, with the patterned layer of conductive material, a substantially planar surface topology with the surface portions of the conductive material regions exposed. This is followed by a plurality of successively formed, substantially planar, composite layers of insulating material and conductive material defining a prearranged pattern of vertical and horizontal interconnect pathways, at least some of which are in contact with the patterned layer of conductive material which is disposed directly on the silicon oxide layer.

In accordance with another aspect of this invention the above-stated objects are achieved in a process for forming on an integrated circuit wafer a plural layer conductor interconnect pattern consisting of a plurality of successively formed, substantially planar composite layers of insulating material and conductive material serving as part of a vertical and horizontal interconnect system. In this process, the first step for forming each composite layer comprises forming a pattern of regions of said conductive material on the substrate. The next step is to form over the pattern of regions of conductive material a layer of insulating material to a thickness substantially greater than the thickness of the conductive material and having a substantially planar top surface. The final step involves removing the top surface portions of the layer of insulating material down to the top surfaces of the regions of conductive material, leaving a substantially planar composite layer of the conductive material regions and the surrounding insulating material regions.

Preferably the step of forming a layer of insulating material over the regions of conductive material includes dispensing onto the wafer a volume of a liquid form of the insulating material to fill the gaps between the regions of conductive material and to build up layer of the insulating material having a substantially planar top surface. The step of forming the pattern of regions of conductive material may include the steps of forming a continuous layer of conductive material on the substructure and patterning the layer of conductive material using straight forward photolithography and selective etching steps. Preferably, however, the step of forming the pattern of regions of conductive material includes the following sequence of steps. First there is formed on the substructure a layer of a second insulating material having an etch rate substantially greater than the first insulating material for at least one selected etchant. Next a mask pattern layer of a selected material is formed over the layer of second insulating material to define an etch aperture pattern therefor. This is followed by etching apertures in the first layer generally corresponding to the etch aperture pattern. Next a layer of conductive material is formed over the mask pattern layer and also within the apertures formed in the first layer. This is followed by the step of removing the mask pattern layer and portions of the layer of conductive material carried thereon. The final step is to remove the remaining regions of the first layer, leaving only the regions of the conductive layer deposited within the apertures originally formed in the first insulating layer. Thereafter, the step of depositing the first insulating material and the etch back operation set forth above can be carried out to finish the composite layer.

The process of this invention is specially adapted to be employed on an IC wafer having a substantially varying surface topology with surface hills and valleys. In this adaptation, the process involves first forming in the valley regions a first plurality of successive composite layers of insulating material and conductive material to define vertical multilevel contact columns of conductive material in preselected valleys and to fill all valleys substantially to the height of the highest hill. Thereafter, the process concludes with forming on the wafer a plural layer conductor interconnect pattern consisting of successively formed, substantially planar composite layers of insulating material and conductive material.

Preferably the initial step of filling in the valleys of surface topology on the wafer consists of forming a pattern or regions of conductive material in preselected valleys, then forming over the pattern of conductive regions a layer of insulating material having thickness substantially greater than the thickness of the conductive material at least in the valleys and then removing top surface portions of the layer of insulating material down to the top surface of the regions of conductive material in the valleys while removing all regions of the layer of insulating material on the hills. These steps are carried out until the wafer has been substantially completely planarized with vertical conductor contact columns to required portions of the wafer within the valleys.

This invention also features a process performing a plural layer conductor interconnect pattern on an integrated circuit wafer having thereon a substantially planar layer of insulating material patterned to define contact windows to substrate regions. In this process the first step involves forming on the patterned layer of insulating material a patterned layer of conductive material including separate regions filling the contact windows and overlying the edges thereof to form a nonplanar surface topology. The next step is to form over this patterned layer of conductive material a layer of insulating material to a thickness substantially greater than the thickness of the layer of conductive material and having a substantially planar top surface. Next the top surface portions of this layer of insulating material are removed down to the top surface of the region of conductive material forming a substantially planar surface on the wafer. Thereafter a plural layer conductor interconnect pattern is formed. The steps for forming the plural layer interconnect pattern may utilize the process of the above-referenced copending Chiang application or the preferred process of this invention.

The system and method of this invention provides numerous advantages over the prior art multilevel interconnect systems depicted in FIGS. 1 to 3 and also provides advantages over the interconnect system and method disclosed in the above-referenced copending Chiang application. The system and method of this invention provides high interconnect density and is readily adaptable to use with any wafer topology which may be produced in forming integrated circuit devices on the wafer. The preferred embodiment of the process of this invention utilizes only etching steps in which the layer of material under the layer being etched has etch stop characteristics except for the etch back of the layer of insulating material which is formed over the patterned regions of conductive material. This etch back step may readily be carried out in a controlled fashion to avoid etching back too far below the top surface of the conductive material regions. Furthermore, if the etch back operation proceeds too far in removing the layer of insulating material, this is easily remedied by recoating the wafer with the same insulating material and redoing the etch back operation.

The simplified multilevel interconnect system and method of this invention should dramatically increase the interconnect density achievable on integrated circuits and thus contribute substantially to realizing high circuit densities in future very large scale integrated circuit technology. The system and method of this invention will also contribute to improvements in yield since the surface of each finished layer is flat and only easily controllable process steps are involved in the process of forming the interconnect system.

Another advantage of the system and method of this invention is that the thickness of the conductive layers in the interconnect system and the insulator thickness between conductive layers can be customized in localized regions of each integrated circuit chip. This enables the interconnect pattern to be tailored to use thicker metal regions in sections of the chip requiring high power. Furthermore, in sections of the chip where low capacitance between overlying metal layers is required, this can be achieved by building up more insulator layers between conductive layers. Accordingly, this invention creates substantially greater flexibility in tailoring the interconnect system to the localized requirement of each section of integrated circuit chip.

The plural level conductor interconnect system of this invention shares many of the advantages of the system disclosed in the copending Chiang application. The interconnect density of the system of this invention is substantially greater than that of the prior art systems shown in FIGS. 1 through 3. In other words, interconnect or contact regions between the substrate and the first conductor layer in between successive conductor network levels in the system occupy a much smaller area. This enables the contact regions within the substrate itself to be placed closer together and reduces interconnect system constraints on circuit density. The planar nature of the interconnect system of this invention eliminates the steep metal steps which are inherent in certain prior art systems. This substantially eliminates problems associated with steep metal steps such as fracturing and open circuiting which cause defective circuits and reduce overall production yield.

Furthermore, because of the planar nature of the interconnect system of this invention, virtually any desired number of levels of interconnect can be provided on the wafer and any level of the interconnect network can be effectively connected to any other level without consuming a large chip area. It is feasible to provide five or more levels of interconnect where even the top level can be effectively connected to a substrate region via a direct vertical interconnect path through metal regions in successive composite insulator and metal layers. The structure of the plural level interconnect system of this invention may be especially advantageous in future VLSI integrated circuit technology which may involve the fabrication of several different types of integrated chips on a single wafer with interconnection between the various chips in order to implement a computer system on a chip concept. The multilevel interconnect system of this invention would facilitate a complicated interconnect pattern for different integrated circuits fabricated on a single wafer. The system of this invention will also provide virtually unlimited flexibility for the integrated circuit designer to interconnect various portions of a large circuit on a chip. Finally, the system of this invention may provide substantial assistance in achieving integrated circuit technologies in which multiple levels of stacked circuit elements are provided to achieve a three dimensional integration of circuit components.

The process for forming a plural level conductor interconnect system in accordance with this invention utilizes to great advantage the method of patterning a material which is generally called the "lift off" method and which has generally been discarded by the semiconductor industry. Furthermore, it utilizes this "lift off" process in a unique manner because the patterned masking layer is utilized both as an etch mask pattern for an underlying insulating layer and as a lift off mask pattern for a layer of conductive material subsequently deposited on the wafer. This provides self-alignment between the aperture etched in the insulating layer and the region of conductive material which remains on the wafer after the lift off process has been performed. This eliminates mask registration problems and design rule tolerances which must be accounted for in sequential masking and etching steps as is required in prior art multilevel metal interconnect systems. Accordingly, the process of this invention produces a plural level conductor interconnect system which eliminates many of the metal contact pad overlap requirements which are inherent in prior art interconnect systems and which consume substantial areas on the integrated chip.

Other objects, features, and advantages of this invention will be apparent from a consideration of the following description taken in conjunction with the accompanying drawings.

DETAILED DESCRIPTION

FIGS. 1–5 have already been discussed above and further description thereof at this point is not required.

Figure 6:
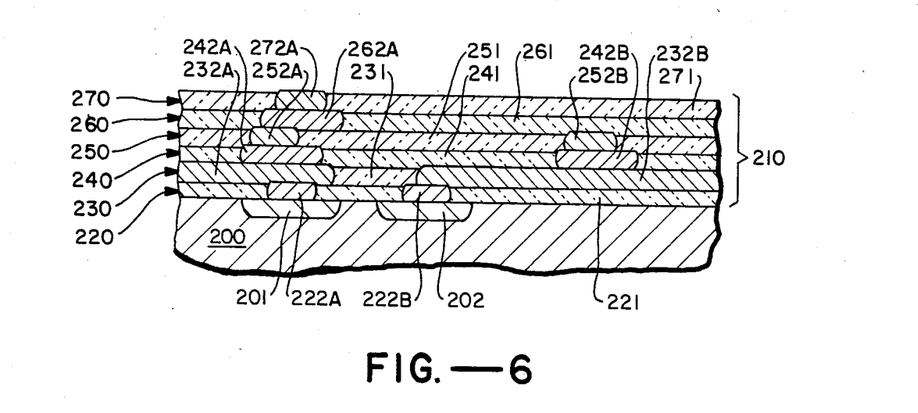
FIG. 6 is a section view of one embodiment of a multilevel interconnect system in accordance with this invention.

As shown in FIG. 6 the cross-sectional topology of an improved multilevel conductor interconnect system in accordance with this invention can be made generally similar to that of the interconnect system of the above-referenced copending Chiang application disclosed in FIG. 5. The interconnect system of this invention generally involves a semiconductor wafer 200 and a multilevel conductor interconnect system 210 formed on the surface of wafer 200. The wafer 200 generally depicted in FIG. 6 is exemplary of a wafer processed in accordance with some type of semiconductor technology involving fabricating circuit components in the wafer itself with little or no topologic structure built on the surface of the wafer. However, it will later be described how the multilevel conductor interconnect system of this invention can be adapted to specific types of semiconductor technology such as, for example, conductor-insulator-semiconductor (CIS) processes which involve forming circuit components by fabricating doped regions within the substrate and overlying structures on top of the substrate using various insulating and conducting layers. In addition, adaptation of this invention to bipolar technology, starting with a nonplanar surface topology on the wafer, will also be discussed.

From a comparison of the structure of the interconnect system in FIG. 6 and the system disclosed in FIG. 5, it is seen that the interconnect density of the two systems is generally comparable. As depicted in FIG. 6, multilevel conductor interconnect system 210 involves six planar composite layers of insulating and conductive material designated 220, 230, 240, 250, 260, and 270. Each of the composite layers 220-270 consists of regions of a single type of insulating material and regions of a conductive material. Thus for example the composite layer 220 consists of regions 221 of insulating material and regions 222A and 222B of conducting material. Similar three-digit designations are given for the various insulating and conducting regions in the other layers 230-270, wherein the insulating regions are designated with the numeral 1 in the units position of each reference numeral and metal or conductive regions are designated with the numeral 2 in the units position.

Each layer of the interconnect system 210 generally has the same structural characteristics i.e. is a composite of a single insulator material and a conductive material. This contrast with the interconnect system 110 in FIG. 5 wherein each layer generally has a composite of two different insulator materials and a conductive material. The topography of the multilevel interconnect system 210 shown in FIG. 6 has generally the same characteristics as the topography of the interconnect system 110 as depicted in FIG. 4. It will thus be appreciated that the improved interconnect density attributed to the multilevel interconnect system 110 is also achieved by the multilevel interconnect system 210.

Figure 23:
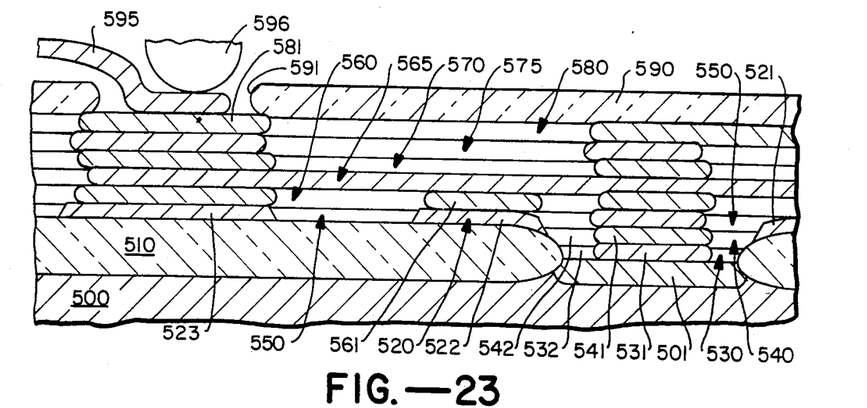
FIG. 23 is a section view of the topology of a multilevel conductor interconnect system formed on a wafer having substantially irregular surface topology.
Figure 24:
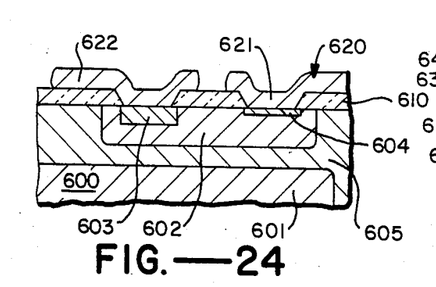
FIGS. 24–29 illustrate wafer topology at various stages of an alternative process for forming a multilevel conductor interconnect system in accordance with this invention on a wafer having irregular surface topology.
Figure 25:
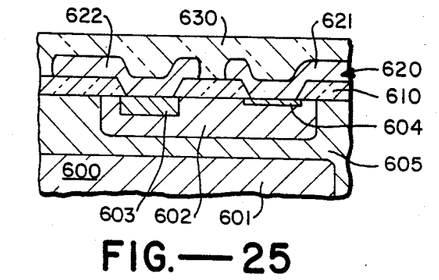
Figure 26:
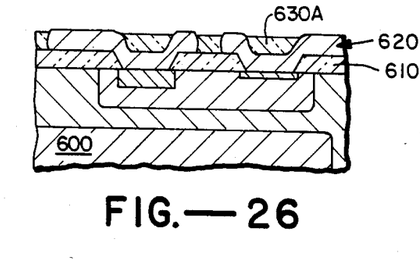
Figure 27:
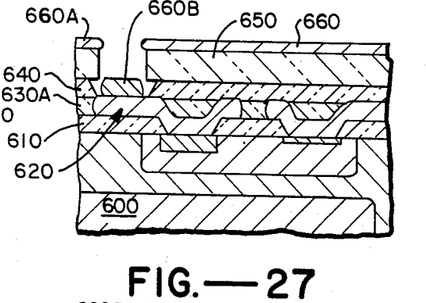
Figure 28:
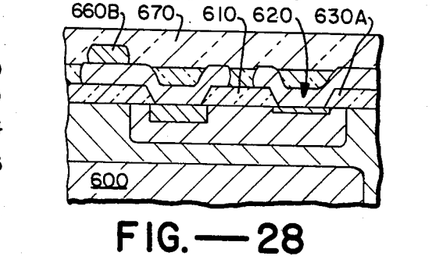

It will be apparent that the structure of the multilevel interconnect system 210 of this invention totally eliminates large metal steps which are prevalent in the interconnect system of the prior art depicted in FIGS. 2 and 3 and also has a simplified structure over the interconnect system 110 in FIG. 5. Complete design freedom in building a vertical and horizontal arrangement of interconnects is provided by the system of this invention. Any of the composite layers 220-270 except the first may be utilized as a conductor pathway provided undesired short circuiting of other conductor pathways in adjacent levels is not produced. Furthermore, double or triple thickness metal pathways or double or triple thickness insulating layers between overlying metal pathways can be provided. Any desired number of interconnect levels can be provided with complete design freedom in connecting between levels within a small area. For example, even with six or seven or more levels of interconnect using the system of this invention a vertical connection between the substrate and the top interconnect level can be readily provided without producing any metal step which could fracture and produce open circuit conditions. Such a vertical interconnect column is shown on the lefthand portion of the drawing of FIG. 6 involving separate conductive material regions 222A, 232A, 242A, 252A, 262A, and 272A. As will later be seen this ability to form a columnar array of conductive regions in a plurality of successively overlying composite layers is advantageously utilized at bonding pad sites on each integrated circuit chip to provide a nonresilient bonding pad site which insures good thermocompression bonding of a wire lead or other type of lead to the bonding pad as part of the process of connecting the IC chip to external circuitry. Such a structure is shown in FIG. 23 and will be described in more detail later.

Figures 7, 8, 11, 12:
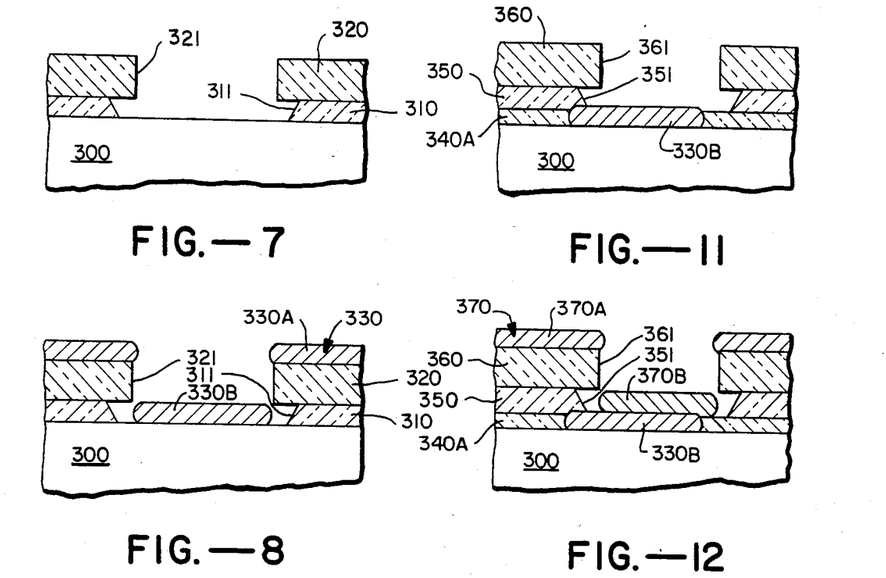
FIGS. 7–14 illustrate wafer topology of various stages of a process for forming a multilevel conductor interconnect system in accordance with this invention.

FIGS. 7-14 illustrate one version of a process in accordance with this invention for forming a multilevel conductor interconnect system. For purposes of this discussion a substantially planar substructure 300 will be assumed. This substantially planar substructure 300 may comprise an integrated circuit with circuit elements formed in the substrate itself or in the combination of substrate and epitaxial layers of the wafer. Alternatively, the substructure may comprise a processed wafer which has irregular surface topology which has been rendered planar using an aspect of the process of this invention which will be described below. The first step of the method of this invention is to form, on the surface of substructure 300, a layer of insulating material 310. Initially the layer 310 is unpatterned and covers the entire wafer surface. A masking layer 320 is then formed over the layer 310 of insulating material and the masking layer 320 is patterned to have apertures therein such as aperture 321. It should be understood that only a small fragmented section of an overall wafer substructure is shown in FIG. 7 and numerous aperture patterns would be present across the entire wafer surface.

After patterning of the masking layer 320, the layer of insulating material 310 is patterned to have an aperture 311 which generally corresponds to the aperture 321. However, the layer 310 is undercut, providing an overhang of the masking layer 320. Layer 310 may be formed of any convenient insulating material, such as, for example, silicon oxide, silicon nitride, aluminum oxide, and the like. For most purposes, a layer of silicon dioxide grown or deposited on the surface of substructure 300 will be utilized. Masking layer 320 may comprise any masking material which has differential etch characteristics with respect to the layer 310 for a selected etchant. Layer 320 may be a layer of organic photoresist material which is patterned using normal photomasking and developing techniques or layer 320 may consist of an inorganic oxide or nitride material which has etch differential characteristics with layer 310 and is first patterned using photolithography techniques. The simplest approach is to utilize the photoresist itself as the mask pattern layer 320 and for purposes of this discussion a layer of photoresist will be assumed. Also for purposes of this discussion the layer 310 will be assumed to be a silicon oxide. The thickness of silicon oxide layer 310 is not critical and it may be formed in the range of about 6,000 to 9,000 Angstroms. The lower portion of that range is entirely suitable and will thus be convenient to use in wafer processing so long as the layer of metal to be formed on the wafer in a subsequent process step is formed to a thickness somewhat less than the thickness of layer 310 for reasons which will be discussed in detail later. The photoresist layer 320 is preferaly made about twice the thickness of the oxide layer 310.

After the photoresist layer 320 and the oxide layer 310 have been patterned as shown in FIG. 7, a layer 330 of conductive material is formed over the entire wafer, thereby forming metal regions 330A carried on top of the photoresist layer 320 and separate 330B on the surface of the substructure 300 within the apertures 311 and 321. The conductive material of the layer 330 may be any conventional conductive material used in the semiconductor industry such as aluminum or various aluminum alloys. Furthermore, the conductive layer 330 may be a multilayer structure utilizing, for example, a platinum-silicon alloy as the bottom layer, a titanium-tungsten alloy as an intermediate layer, and aluminum for the top layer. Any other composite conductive layer utilized in the semiconductor industry may also be employed.

For purposes of this discussion, the layer 330A will be referred to simply as a metal layer without intending to restrict the invention to such a layer. The thickness of metal layer 330 is preferably less than the thickness of oxide layer 310. This, together with the undercut of the oxide layer, eliminates the tendency of the edges of the metal region 330 creeping up the side of the photo resist aperture 321. A difference of about 500 to 1,000 Angstroms in thickness of the metal layer 330 and the oxide layer 310 is sufficient to eliminate this tendency. However, for purposes of this invention, substantially larger thickness differences can be tolerated since, as will later be seen, oxide layer 310 is ultimately removed from the substructure as part of the process of this invention.

After depositing the metal layer 330, the photoresist layer 320 and sections 330A of metal layer 330 carried on the photoresist layer 20 are lifted off the wafer leaving metal region 330B in contact with the substructure. This lifting off of the photoresist layer and overlying metal regions may be accomplished in any conventional fashion, for example by using a photoresist asher which attacks the photoresist with a plasma such as oxygen plasma which does not attack silicon dioxide layer 310. After the photoresist layer 320 and overlying metal regions have been removed, the remaining regions of oxide layer 310 are removed. Various plasma or wet chemical etching operations well-known in the semiconductor industry may be utilized to remove the oxide layer 310. For example, a freon plasma etching operation may be carried out to remove the oxide layer. After the step of the process is performed, the metal region 330B alone will remain on the surface of substructure 300.

At this juncture it may be pointed out that an alternative way of forming the metal region 330B on the substructure 300 would be to use a standard metal deposition, photomasking and etching process. While such an alternative process step is within the comtemplation of this invention, the preferred method is to use the lift off method previously described, followed by the etching away of the oxide region 310. The reasons for preferring the lift off process will be discussed below in connection with the formation of the next metal section on top of the metal region 330B.

The next step in the process of this invention involves forming a layer of insulating material 340 on the surface of substructure 300 over the metal region 330B to a thickness greater than the metal region 330B and in a manner which produces a substantially planar top surface of the insulating layer 340. Preferably this step is carried out using an insulating material which is initially in liquid form. Planar layer 340 may then be formed by dispensing a liquid solution of the insulating material onto the substructure 300 and then spinning the wafer substructure at several thousand revolutions per minute to uniformly distribute the dispensed solution across the wafer surface. Layer 340 may be a single coating of insulating material or may comprise several separate layers built up to a final layer thickness without requiring any curing step between layers. It may be desirable first to put a thin coating of insulator material on the wafer in order to fill in the gaps between adjacent metal regions 330B and thereafter apply a thicker coating on the insulating material to build up the final layer thickness.

The material of insulating layer 340 may be any suitable organic polymer insulating material such as, for example a polyimide material sold by Hitachi Corporation under the trade designation PIQ or a Dupont polyimide material designated PI-2560. The insulating layer 340 may also be a spin on glass layer such as an alcohol solution of silicon dioxide marketed under the designation SILICAFILM by the Emulsitone Company of Whippany, N.J., provided that the subsequent insulating layer 351 utilized in forming the next metal region has sufficient etch differential characteristics with the spin-on glass material. For purposes of illustrating the process of this invention, the use of a polyimide material as the planar insulating layer 340 will be assumed.

Figures 10, 14:
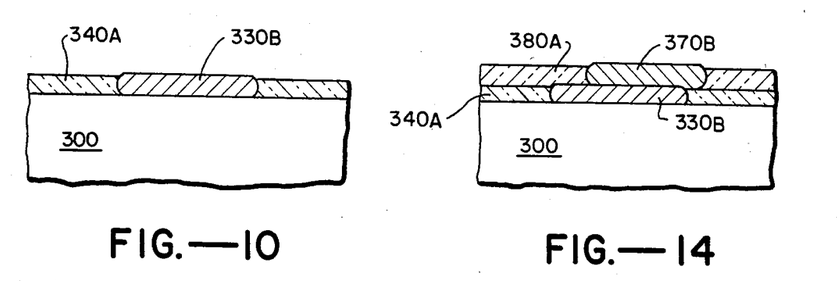

The next step in the process of this invention is to etch back the polyimide layer 340 to expose the top surface of the metal region 330B. The result of this operation is depicted in FIG. 10 wherein a bottom region 340A of the polyimide layer 340 is left on the substrate. The thickness of this residual polyimide layer 340A should be about 500 to 1,000 Angstroms less than the thickness of the metal region 330B. The etch back operation may be carried out using an oxygen plasma. If desired, ion milling or reactive ion etching can be used instead. The etch operation proceeds vertically until the surface of the metal region 330B is exposed.

To form a second composite insulator and metal layer, the same process steps are repeated as depicted in FIG. 11-14. A second layer of oxide 350 and second layer of photoresist 360 are formed over the first composite layer and are patterned to form the apertures 351 and 361 as shown. The second layer of metal 370 is deposited, forming metal regions 370A on top of the photoresist layer 360 and a second metal section 370B on top of the first metal section 330B. As shown in FIGS. 11 and 12, the process of this invention does not require that the apertures 351 and 361 in the oxide layer 350 and photoresist layer 360, respectively, be exactly aligned with the metal section 330B previously formed on the wafer. Provided that there is sufficient overlap of the metal region 370B with the underlying metal region 330B, the metal region 370B can be displaced slightly in any direction from the position of the underlying metal region 330B.

After the photoresist layer 360 has been removed to lift off the overlying metal sections 370A and the oxide layer 350 is etched away, the structure of the interconnect system would appear with metal region 370B overlying the metal regions 330B. At this point it should be noted that the oxide layer 350 may be initially patterned using either a plasma or wet chemical etch and an etchant which is etched selective for removal of oxide but does not substantially attack polyimide. Preferably a freon plasma etch which removes the oxide layer 350 without substantial removal of polyimide will be used in this process. In addition, when the remainder of the oxide layer 350 is removed, the polyimide layer section 340A serves as an etch stop so that great care in etching of the oxide layer 350 is unnecessary.

Figures 9, 13:
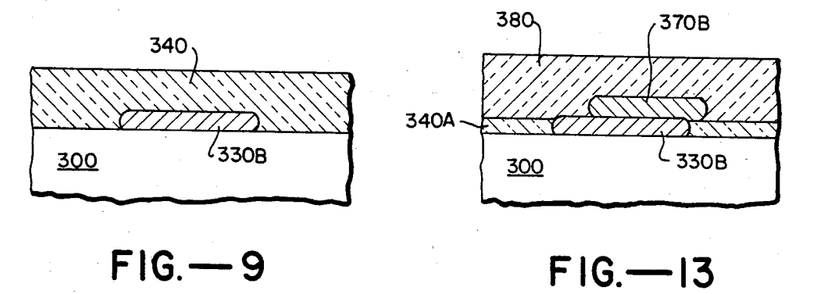

The remainder of the second composite layer is produced by first depositing the thick polyimide layer 380 shown in FIG. 13 and then etching back the polyimide layer 380 to the surface of the metal region 370B. This produces the second composite layer consisting of metal region 370B and polyimide region 380A as shown in FIG. 14. Repeating these process steps will build up as many composite layers as desired.

All of the composite layers are planar and all of the process steps are relatively non-critical and can be performed with high yield.

At this juncture it should be noted that, if metal patterning using photolithography and etching is performed as an alternative to the lift photoresist off method, some care must be taken in etching of the second and subsequent metal layers in order to avoid substantial etching of any exposed portions of underlying metal regions. Some overetching of these underlying regions can be tolerated but drastic overetching might produce problems in maintaining planar layer structure.

Figure 15:
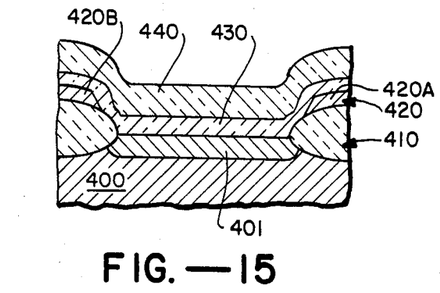
FIGS. 15–22 illustrate wafer topology at various stages of a process in accordance with this invention for forming a multilevel conductor interconnect system on a wafer having substantially irregular surface topology.
Figure 16:
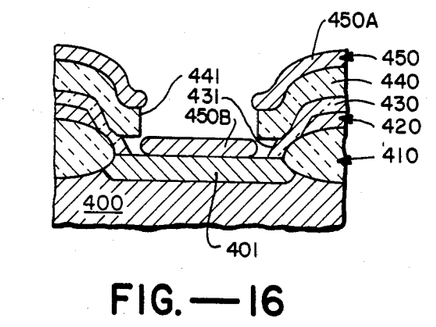
Figure 17:
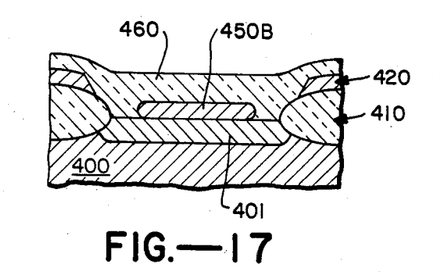
Figure 18:
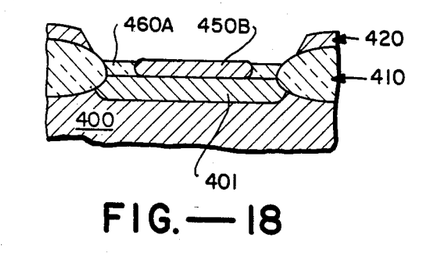
Figure 19:
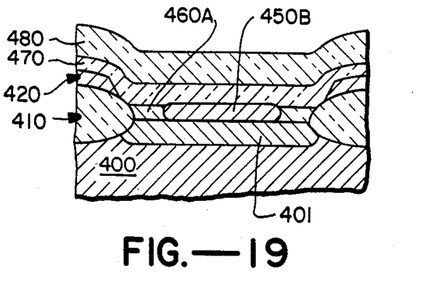
Figure 20:
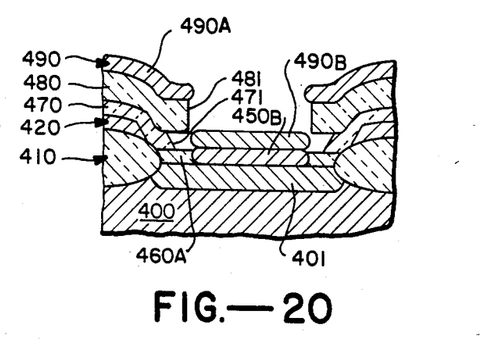
Figure 21:
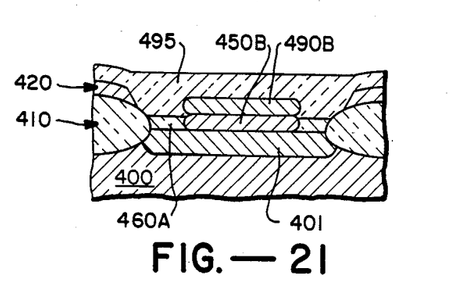

FIGS. 15-22 illustrate an adaptation of the process of this invention to forming a multilevel conductor interconnect system on a processed wafer which has substantially varying surface topology, consisting of hills and valleys due to the formation of insulator and conductor material structures on the surface of the wafer as well as the formation of doped regions within the wafer itself. FIG. 15 illustrates for example the topology of a CIS integrated circuit device having field oxide regions 410 surrounding a doped region 401 in the wafer 400. In addition, regions of doped polysilicon 420 may be carried on top of field oxide regions 410 as part of a first level of interconnect or as resistor elements in the integrated circuit chip. The doped region 401 may for example be an enlarged contact region associated with a source or drain region of a field effect transistor or an array of field effect transistors on the chip.

In order to provide electrical signals to the doped region 401 it is necessary to provide a conductor structure contacting the surface of the wafer 400 at that location. In normal prior art CIS process technology a deposited oxide layer would be formed over the wafer of a thickness of about 8,000 Angstroms, this oxide layer would be patterned using photolithography and etching to provide a contact window to the substrate. This would be followed by metal deposition and patterning to form a substantially V-shaped contact to the substrate. To form a multilevel interconnect system using this initial metal layer would require the use of the prior art technique depicted in FIG. 2 or else some planarization of the wafer surface would need to be performed prior to performing a mulitlevel conductor interconnect system of this invention. To render the topology of the wafer planar, it would be possible to utilize the approach generally depicted in FIGS. 24-29, but that approach somewhat reduces the interconnect density which can be achieved. The approach depicted in FIGS. 15-22 is preferred since it permits local formation of planar composite layers of metal and insulator material to build up a structure which fills in the valleys of the wafer topology until a planar surface is produced.

Thereafter, a mutilevel conductor interconnect system accordance with this invention as depicted in FIGS. 7-14 can be employed.

The particular adaptation of the process of this invention to a wafer of substantially varying surface topology begins with the formation of an oxide layer 430 over the surface of the wafer on top of which is formed a photoresist layer 440. By using the same process steps as previously described in connection with FIG. 7 and 8, the photoresist layer 440 is first patterned to form an aperture 441 therein followed by the etching of the oxide layer 430 to form an aperture 431 therein. Thereafter, metal layer 450 is deposited on the wafer with regions 450A overlying the photoresist 440 and a separate region 450B lying within the apertures 431 and 441. Photoresist layer 440 is then removed together with the overlying metal regions 450A, followed by removal of the oxide layer 430. This results in the metal region 450B remaining on the surface of the wafer 400 in contact with the doped region 401.

The next step is to deposit polyimide layer 460 over the wafer 400 to a thickness in the valleys substantially greater than the thickness of the metal region 450B. In this case the polyimide layer 460 need not be entirely planar at the top surface but should be substantially planar in the valley region. Next the polyimide layer 460 is etched back to just below the surface of the metal region 450B, producing the structure shown in FIG. 18. In this case, the composite metal and insulator layer formed by metal region 450B and polyimide region 460A lies solely within the valley on the wafer, i.e. it does not extend across the total wafer surface. It should be understood that on a typical wafer a large number of such valleys would be present and thus the first composite metal and polyimide layer on the wafer simply partially fills in the valleys. There may be on a typical wafer some partial valleys which do not extend all the way down to the substrate surface. Such valleys would not begin to get filled in until the planarization process using composite metal and polyimide layers reaches that level of the topology on the wafer.

Figure 22:
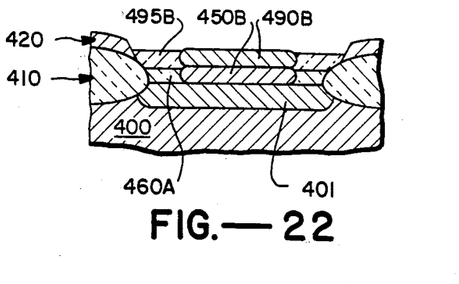

FIGS. 19-22 illustrate the repeating of the same process steps to develop a second composite layer consisting of a metal section 490B and a polyimide section 495B as shown in FIG. 22. After three or four repetitions of the same process steps, the valleys of the wafer have been filled in to the height of the highest hill. At that point the wafer substructure has a substantially planar surface and a multilevel interconnect system can be formed thereon. It should be apparent that, in addition to using the multilevel conductor interconnect structure of this invention, it is within the purview of this aspect of this invention also to utilize the multilevel interconnect system of the above-referenced copending Chiang application.

FIG. 23 illustrates a five-level conductor interconnect structure formed on a CIS integrated circuit wafer with planarization of the wafer topology accomplished by three composite metal-polyimide layers which fill in the valleys of the wafer. The three composite layers which fill in the valleys are layers 530, 540, and 550 and the layers forming the multilevel conductor interconnect structure are the layers 560, 565, 570, 575, and 580.

As shown in FIG. 23, one metal region 561 of layer 560 is utilized to make contact with a polysilicon region 520 formed on top of field oxide structure 510. From the description given in connection with FIG. 15-22 and the topology shown in FIG. 23, it should be apparent that the process of this invention could also be applied to dual level polysilicon CIS structures and virtually any other CIS or other semiconductor technology which produces a surface topology having hills and valleys therein.

FIG. 23 also illustrate the advantage of being able to form a column of conductor sections, e.g. the column on top of polysilicon region 523, in order to provide a solid, nonresilient contact pad to which a contact wire 595 may be bonded. In the prior art multilevel interconnect approach depicted in FIG. 3, using the polyimide insulating layer to partially planarize the metal layers, the bonding pad is typically formed on top of a structure which consists of intervening polyimide layers between conductive layers. This produces a resilient structure and tends to cause a thermocompression bonding probe and contact wire to bounce off of the contact pad. This tends to produce an unreliable bond and may result in a wire bond or lead bond defect. The structure shown in FIG. 23 obviates this problem since the column of metal regions provides a solid structure for good thermocompression bonding of the wire 595 thereto using the bonding probe 596.

FIG. 23 further illustrates the advantage of this invention that any level of the multilevel interconnect structure can be directly connected to the bonding pad 581 rather than simply at the top layer 580. This again shows the flexibility of the multilevel interconnect system of this invention.

FIGS. 24-29 illustrate the adaptation of the process of this invention to forming a multilevel conductor interconnect structure on a bipolar wafer for which it is important to retain the final silicon oxide layer 610 on the surface of wafer 600. The fragment of the wafer 600 shown in FIG. 24 includes a burried layer region 601, an epitaxial layer 605, a base region 602 formed in the epitaxial layer, an emitter region 603 and a base contact region 604. Contact windows are present in the silicon oxide layer 610. A first metal layer 620 is formed on the wafer 600 and patterned to perform a first metal interconnect layer similar to the first layer in the prior art structure of FIG. 2. Accordingly two separate metal regions 621 and 622 are formed in contact with the emitter region 603 and the base contact diffusion 604.

The next step is to planarize the topology of the wafer 600 by forming a layer of polyimide 630 thereon to a thickness greater than the thickness of the metal layer 620 and having a substantially planar top surface. The next step is to etch back the polyimide layer 630 to a point just below the surface of the metal regions 621 and 622. After this planarizing step produces the topology depicted in FIG. 26, a multilevel interconnect system can be formed on the wafer. The first step in forming the next composite metal-insulator layer proceeds with the deposition of oxide layer 640 followed by the formation of photoresist layer 650. Then patterning of the photoresist layer 650 is performed, followed by etching of the oxide layer 640. Metal layer 660 is then deposited to form the contact 660B resting on a pad section of the metal regions 622. The photoresist layer 650 and the oxide layer 640 are then removed leaving the metal region 660B.

Figure 29:
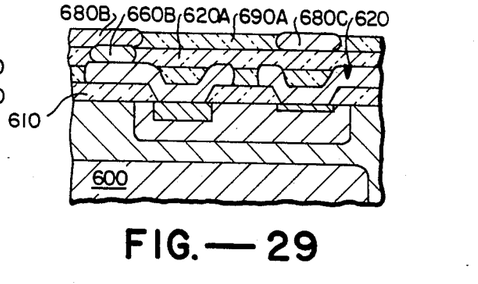

Following this a thick layer of polyimide 670 is disposed on the wafer 600 and is then etched back to the surface of the metal region 660B. This forms the first composite layer consisting of metal regions 660B and insulator region 670A as shown in FIG. 29. FIG. 29 also shows the next successive composite layer consisting of metal regions 680B and 680C together with insulator region 690A.

This same planarizing technique could be employed on a CIS wafer having a deep first metal contact groove. The disadvantage of this method is that it reduces interconnect density by requiring the formation of a contact pad region on the first metal layer 620.

While examples of embodiments of the structure of a plural level conductor interconnect system in accordance with this invention have been set forth above together with several versions of processes for forming plural level conductor interconnect systems in accordance with this invention, it should be understood that numerous modifications could be made therein by persons skilled in this art without departing from the scope of the invention as claimed in the following claims.

What is claimed is:

1. A process for forming an integrated circuit on a substructure having a substantially varying surface topology with surface hills and valleys including the step of forming a plural layer, conductor interconnect pattern and including the step of forming a plurality of successive, substantially planar, composite layers of insulating material and conductive material in said valleys with said insulating material on each layer defining a pattern of regions filled with conductive material to serve as part of a vertical and horizontal interconnect system, the steps for forming each composite layer comprising:
   (a) forming a pattern of regions of conductive material on said substructure, said regions of conductive material having an upper surface;
   (b) forming over said pattern of conductive regions a layer of first insulating material to a thickness substantially greater than the thickness of said conductive material and having a substantially planar top surface; and
   (c) etching back said top surface of said layer of first insulating material down to the top surface of said regions of conductive material.

2. The process of claim 1, wherein said step of forming said first plurality of composite layers comprises the steps of:
   (1) forming a pattern of conductive regions of said conductive material in said preselected valleys said conductive regions having a surface;
   (2) forming over said pattern of conductive regions a layer of insulating material having a thickness substantially greater than the thickness of said conductive material at least in said valleys and having a top surface; and
   (3) etching back said top surface of said layer of insulating material down to the surface of said conductive regions of conductive material in said valleys while removing said layer of insulating material completely on said hills.

3. The process of claim 2, wherein said step of forming said layer of insulating material includes dispensing on to said wafer a volume of a liquid form of said insulating material to fill gaps between said regions of conductive material and to build up a layer of said insulating material having a substantially planar top surface at least within said valley regions.

4. The process of claim 1, wherein said step of forming said pattern of regions of conductive material comprises forming a continuous layer of conductive material on said substrate and patterning said layer of conductive material using photolithography and selective etching steps.

5. The process of claim 1, wherein said step of forming said pattern of regions of conductive material comprises the steps of:
(1) forming on said wafer a layer of second insulating material having an etch rate substantially greater than said first insulating material for at least one selected etchant;
(2) forming a mask pattern layer of material over said first layer to define an etch aperture pattern for said first layer;
(3) etching apertures in said first layer corresponding to said etch aperture pattern using said selected etchant;
(4) forming a layer of conductive material over said mask pattern layer and within the apertures formed in said first layer;
(5) removing said mask pattern layer and portions of said layer of conductive material carried thereon; and
(6) removing remaining regions of said first layer using said selected etchant;

6. The process of claim 5, wherein said first layer of insulating material is an inorganic insulating material, said second layer of insulating material is an organic polymer, and said mask pattern layer is an organic photoresist material.

7. In a process for forming a plural layer conductor interconnect pattern on an integrated circuit wafer having a substantially varying surface topology with surface hills and valleys, the steps of:
(a) forming in said valley regions a first plurality of successive composite layers of insulating material and conductive material to define vertical multilevel contact columns of conductive material in preselected valleys and to fill all valleys substantially to the height of the highest hill; and
(b) forming on said wafer a plural layer conductor interconnect pattern consisting of successively formed, substantially planar, composite layers of insulating material and conductive material.

8. The process of claim 1, wherein said step of forming said layer of insulating material includes dispensing onto said wafer a volume of a liquid form of said insulating material to fill gaps between said regions of conductive material and to build up a layer of said insulating material having a substantially planar top surface.

9. The process of claim 1, wherein said step of forming said pattern of regions of conductive material comprises: forming a continuous layer of conductive material on said substrate and patterning said layer of conductive material using photolithography and selective etching steps.

10. The process of claim 1, wherein said step of forming said pattern of regions of conductive material comprises the steps of:
(1) forming on said substructure a layer of second insulating material having an etch rate substantially greater than said first insulating material for at least one selected etchant;
(2) forming a mask pattern layer of material over said layer of second insulating material to define an etch aperture pattern for said layer of second insulating material;
(3) etching apertures in said layer of second insulating material corresponding to said etch aperture pattern;
(4) forming a layer of conductive material over said mask pattern layer and within the apertures formed in said layer of second insulating material;
(5) removing said mask pattern layer and portions of said layer of conductive material carried thereon; and
(6) removing remaining regions of said layer of second insulating material.

11. The process of claim 10, wherein said layer of first insulating material is an inorganic insulating material, said layer of second insulating material is an organic polymer, and said mask pattern layer is an organic photoresist material.

12. In a process for forming a plural layer conductor interconnect pattern on an integrated circuit wafer having a substantially varying surface topology with surface hills and valleys including the step of forming a substantially planar layer of inorganic insulating material patterned to define contact windows to substrate regions in said valleys, and including the steps of:
(a) forming on said inorganic insulating layer a patterned layer conductive material including regions filling said contact windows and overlying said insulating layer to form a nonplanar surface topology and having a top surface;
(b) forming over said patterned layer of conductive material a layer of organic ploymer insulating material to a thickness substantially greater than the thickness of said layer of conductive material and having a substantially planar top surface;
(c) etching back said planar top surface of said layer of organic polymer insulating material down to said top surface of said patterned layer of conductive material to form a substantially planar frist composite layer exposing said regions of conductive material overlying said inorganic insulating layer.
(d) forming on said first composite layer a plural layer conductive interconnect pattern consisting of a plurality of successively formed, substantially planar, composite layers of insulating material and conductive material.

13. The process of claim 12 wherein said step of forming on said first composite layer said plural layer interconnect pattern comprises the steps of:
(1) forming a next pattern of conductive regions of said conductive material on said first composite layer.
(2) forming over said next pattern of conductive regions a layer of first insulating material to a thickness substantially greater than the thickness of said conductive material and having a substantially planar top surface; and
(3) etching back said substantially planar top surface of said layer of first insulating material down to the top surface of said next pattern of conductive regions.

14. The process of claim 13, wherein said step of forming said layer of insulating material includes dispensing onto said wafer a volume of liquid form of said insulating material to fill gaps between said regions of conductive material and to build up a layer of said insulating material having a substantially planar top surface.

15. The process of claim 13, wherein said step of forming said pattern of regions of conductive material comprises forming a continuous layer of said conductive material on said substrate and patterning said layer of conductive material using photolithography and selective etching steps.

16. The process of claim 13, wherein said step of forming said next pattern of conductive regions comprises the steps of:

forming on said first composite layer a layer of second insulating material having an etch rate substantially greater than said first insulating material for at least one selected etchant;

forming a mask pattern layer of material over said layer of second insulating material to define an etch aperture pattern for said layer of second insulating material;

etching apertures in said layer of second insulating material corresponding to said etch aperture pattern using said selected etchant;

forming a layer of conductive material over said mask pattern layer and within the apertures formed in said layer of second insulating material;

removing said mask pattern layer and portions of said layer of conductive material carried thereon; and removing remaining regions of said layer of second insulating material using said selected etchant.

17. The process of claim 16, wherein said layer of first insulating material is an inorganic insulating material, said layer of second insulating material is an organic polymer insulating material; and said mask pattern layer is organic photoresist.

* * * * *